(12) United States Patent
Pascucci

(10) Patent No.: US 6,324,238 B1
(45) Date of Patent: Nov. 27, 2001

(54) BIT COUNTER STAGE, PARTICULARLY FOR MEMORIES

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/464,631

(22) Filed: Dec. 15, 1999

(51) Int. Cl.$^7$ .................................................. G06M 3/00

(52) U.S. Cl. ............................... 377/26; 377/111; 377/117

(58) Field of Search ................................ 377/26, 111, 117

(56) References Cited

U.S. PATENT DOCUMENTS 6,078,636 * 6/2000 Shirai et al. ............................ 377/26

* cited by examiner

*Primary Examiner*—Margaret R. Wambach
(74) *Attorney, Agent, or Firm*—Jenkens & Gilchrist, P.C.

(57) ABSTRACT

A bit counter stage, particularly for memory addresses, including: a master storage circuit; a slave storage circuit which is connected to the master storage circuit; a circuit for enabling the transit of an external address in the master storage circuit; a circuit for enabling the connection between the slave storage circuit and the master storage circuit; a circuit for enabling the connection between the master storage circuit and the slave storage circuit; a circuit for calculating the product of the external address and of an input carry signal which arrives from a preceding counter stage; and a circuit for calculating an output carry signal on the basis of the external address and of the input carry signal.

46 Claims, 5 Drawing Sheets

BIT COUNTER STAGE, PARTICULARLY FOR MEMORIES

BACKGROUND OF THE INVENTION

The present invention relates to a bit counter stage, particularly for memories. More particularly, the invention relates to a bit counter stage with the associated external address loading path for memories and the like.

It is known that counters are used in a wide variety of situations, one of the most important being the counting of memory addresses.

It is known that a counter is provided by means of a plurality of cascade-connected counter stages, each stage being meant to count one of the bits of, for example, a memory address.

The sum of two binary numbers generates a carry value which must propagate along the counter, through the various stages of the counter, in order to obtain a correct sum.

The carry calculation time is the fact that limits the operating frequency of a counter.

Execution of the carry operation, i.e., its writing time, is the least time-consuming operation; carry generation instead limits and penalizes the operating frequency of said counter.

Owing to the need to increase ever more the operating frequency of the counter and therefore to reduce the period of its operation, in conventional counters in which said period is divided evenly between the carry generation step and the carry calculation step the carry generation step, which is the most penalizing one, may not have enough time available for its execution, whereas the carry execution step has an assuredly excessive amount of time available.

Moreover, any counter has a loading system which allows to load the initial configuration from outside. It is normally believed that loading management performed by means of an ALE control signal is generally free from reliability problems, but in actual fact there are severe difficulties due to the capability to distribute the current count produced by the counter. In conventional counters, the ALE (address latch enable) address in fact can generate a false count in the counter if the ALE signal is "dirty", i.e., accidental, or if it is not an actual ALE signal.

In this case, the configuration assumed in the counter is destroyed in favor of a configuration which is set externally and the count resumes from the new loading instead of from the current calculation. This should not occur.

This situation becomes severe if the counter is directly interfaced with input structures, and in this case the problems involved in preventing possible false updates of the counter become very important.

SUMMARY OF THE INVENTION

The aim of the present invention is to provide an address counter stage, particularly for memories, in which the cycle of the counter is managed with a time-division mode which minimizes the carry execution interval and maximizes the carry creation and propagation interval.

Within the scope of this aim, an object of the present invention is to provide a bit counter stage, particularly for memory addresses, in which the asymmetry of the working cycle of the counter stage allows to raise the operating frequency of said stage.

Another object of the present invention is to provide a bit counter stage, particularly for memory addresses, in which the data item in input to the stage is presented to the actual counter stage with a delay technique which is suitable to filter false pulses and is such as to ensure the validity of the operation that must be performed by the counter.

Another object of the present invention is to provide a bit counter stage in which the updating steps of each stage of the counter are managed with a technique which guarantees the absence of "chasing" in the various steps and of unwanted acceleration of said steps.

Another object of the present invention is to provide a bit counter stage, particularly for memory addresses, in which there is no influence of external stimuli (data) during the counting step of the counter.

Another object of the present invention is to provide a bit counter stage, particularly for memory addresses, which can be used with very fast memories and with low supply voltages.

Another object of the present invention is to provide a bit counter stage, particularly for memory addresses, which is highly reliable, relatively easy to manufacture and at competitive costs.

This aim, these objects and others which will become apparent hereinafter are achieved by a bit counter stage, particularly for memory addresses, comprising:

master storage means;

slave storage means which are connected to said master storage means;

means for enabling the transit of an external address in said master storage means;

means for enabling the connection between said slave storage means and said master storage means;

means for enabling the connection between said master storage means and said slave storage means;

means for calculating the product of said external address and of an input carry signal which arrives from a preceding counter stage; and means for calculating an output carry signal on the basis of said external address and of said input carry signal.

BRIEF DESCRIPTION OF THE DRAWINGS

Further characteristics and advantages of the present invention will become apparent from the following detailed description of a preferred but not exclusive embodiment of the bit counter stage according to the invention, illustrated only by way of non-limitative example in the accompanying drawings, wherein.

DESCRIPTION OF THE PREFERRED EMBODIMENTS

Figure 1:
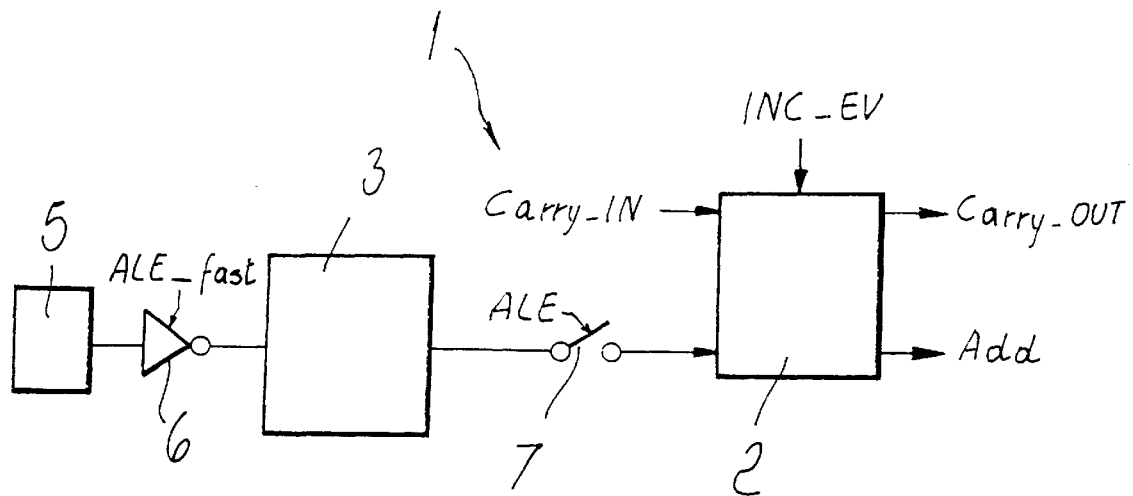
FIG. 1 is a block diagram of a counter stage according to the present invention.

With reference to the above figures, and initially to FIG. 1, the counter stage according to the present invention, generally designated by the reference numeral 1, comprises a bit counter 2 which is suitable to perform the actual counting and receives in input a carry signal CARRY-IN and emits in output a carry signal CARRY-OUT in addition to an address Add.

The counter 2 is preceded by storage means 3 which are conveniently constituted for example by a latch which is meant to store an input address 5 which must be transferred to the counter 2. The address 5 is stored in the latch 3 after passing through a structure of the tristate type 6, which is driven by a signal ALE-fast (fast address latch enable signal), which enables the loading of the external address 5 into the latch 3, but the latch 3 does not present the address 5 to the counter 2 itself until there is an actual ALE signal, i.e., an address latch enable signal, which is assuredly a signal of this type. If the ALE signal is not a true ALE signal dedicated to the counter, the external address 5 in fact is not transferred from the latch 3 to the bit counter 2.

Therefore, between the latch 3 and the bit counter 2 there are switching means 7 which are indeed driven by the ALE signal.

Figure 2:
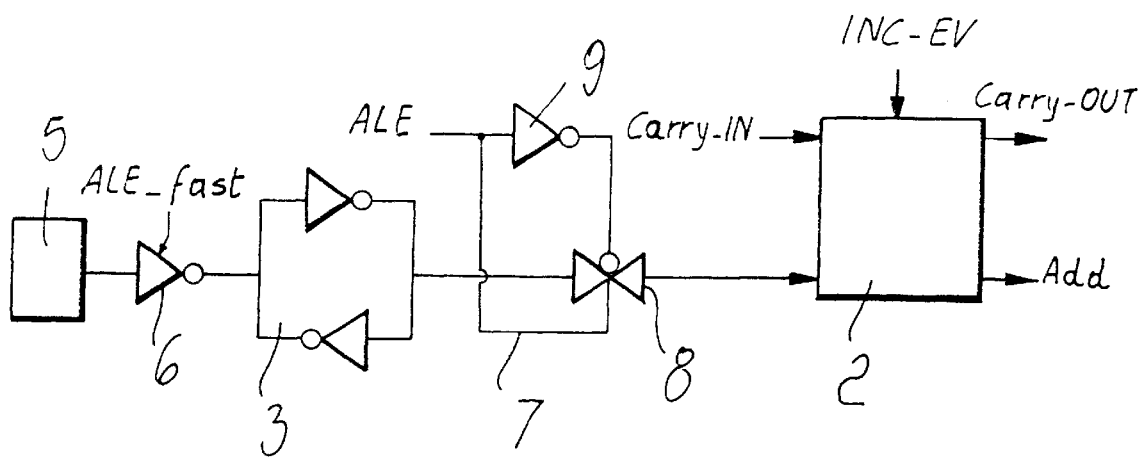
FIG. 2 is a more detailed block diagram of a counter stage according to the invention.

FIG. 2 is a more detailed block diagram of FIG. 1, in which the latch 3 is shown explicitly and in which the switching means 7, represented by a pass transistor 8 and by an inverter 9 which receives the ALE signal in input, are likewise shown explicitly.

Figure 3:
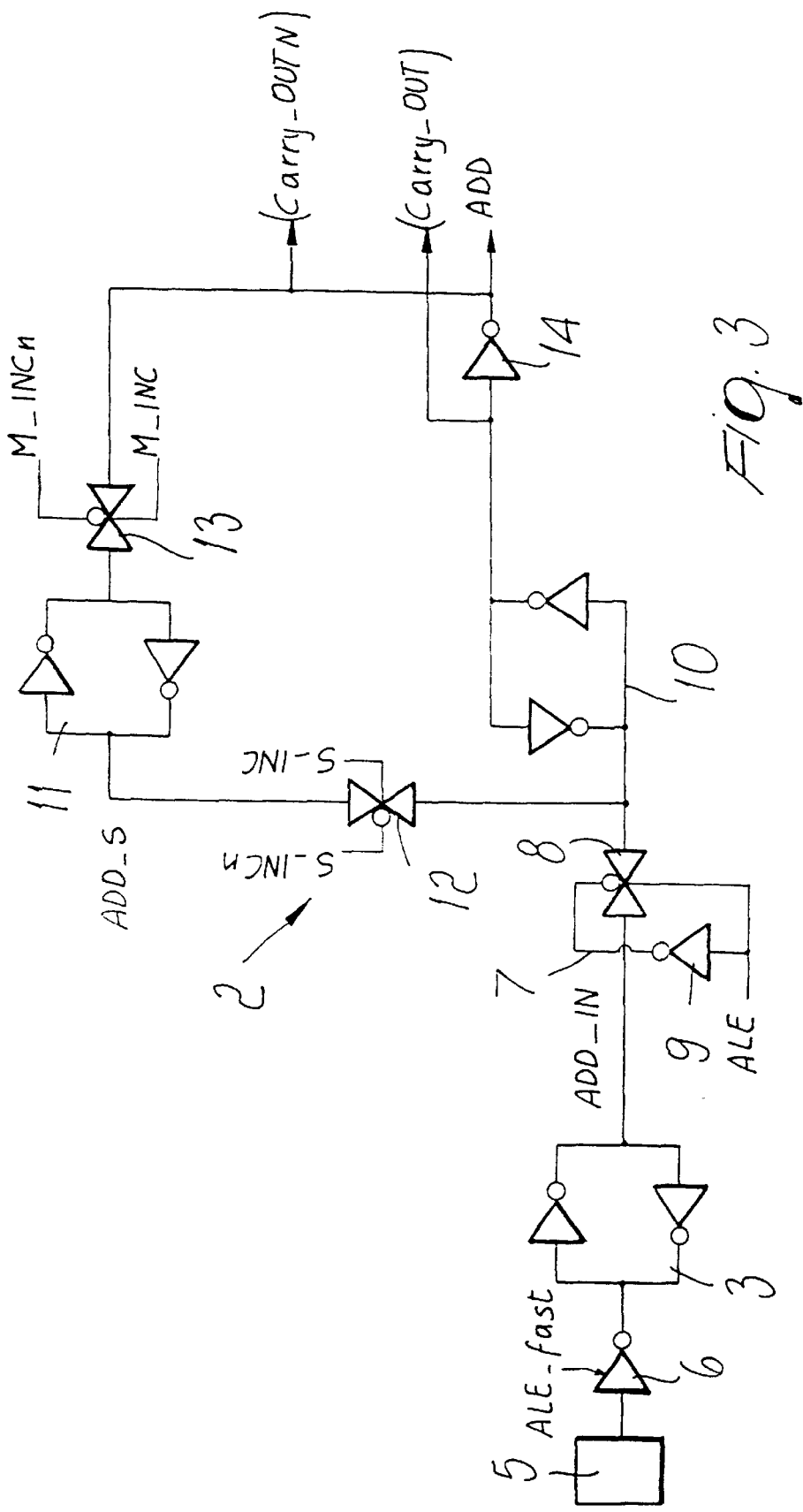
FIG. 3 is a circuit diagram of the first counter stage according to the present invention.
Figure 4:
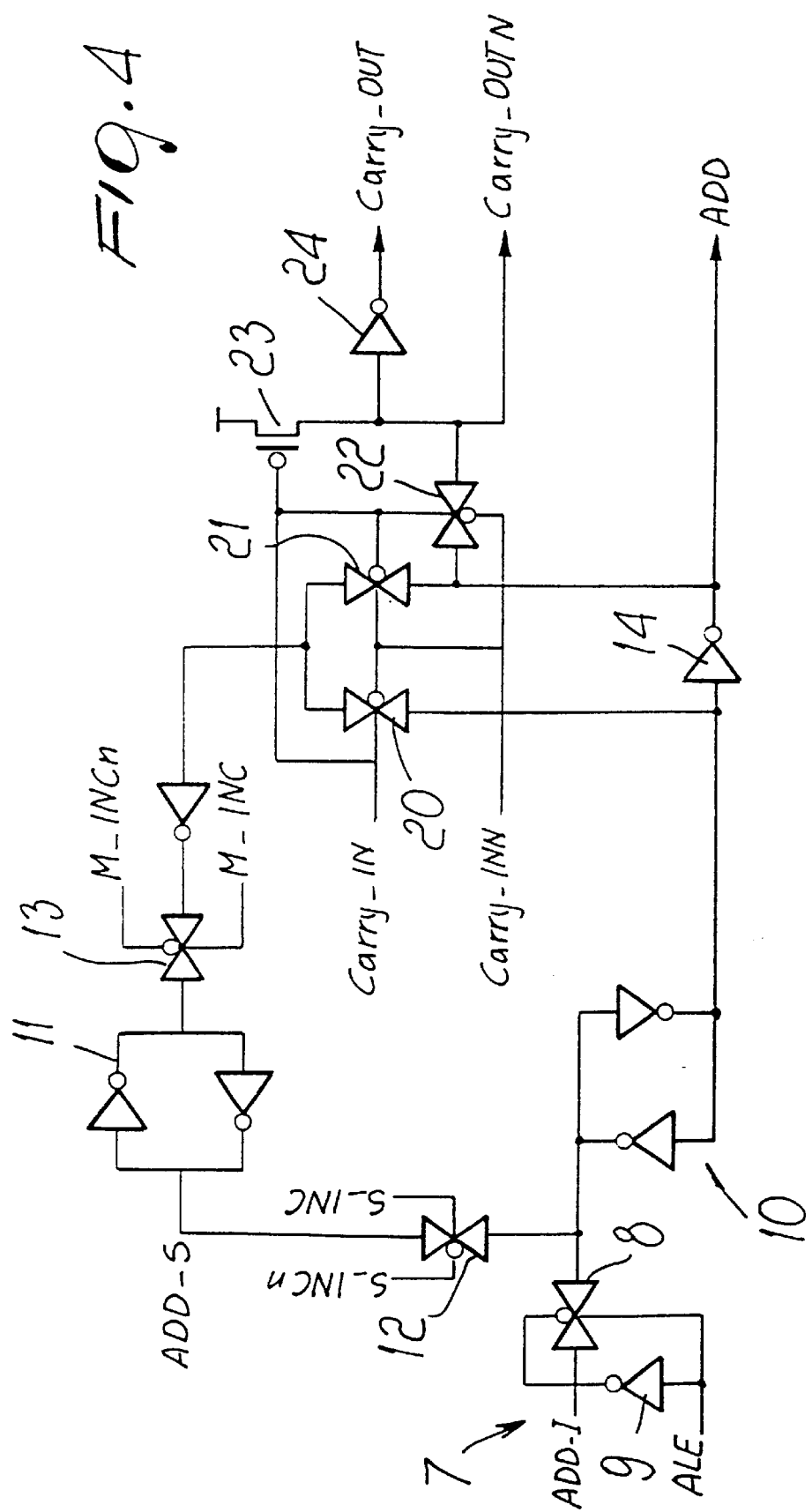
FIG. 4 is a circuit diagram of one of the subsequent counter stages, cascade-connected to the first counter stage shown in FIG. 3.

FIG. 3 is a view of a first bit counter stage according to the invention, whereas FIG. 4 is a view of one of the successive stages, cascade-connected to the first stage, which is shown in FIG. 3.

The carry network in the first stage is not present because it coincides with the address itself.

FIG. 3 therefore explicitly shows the structure of the counter 2 in addition to the storage means 3, the switching means 7 and the enable means (tristate structure) 6.

It should be noted that the output carry, designated by CARRY-OUT and CARRY-OUTN, of the first stage and accordingly of all the subsequent stages of the counter constitutes the input carry CARRY-IN of the subsequent stage.

The actual counter 2, shown in detail in FIG. 3 and likewise in FIG. 4, comprises two latch structures, a master latch structure 10 and a slave latch structure 11, which are mutually connected by first means for enabling the connection between the latch structure 11 and the latch structure 10, designated by the reference numeral 12, and of second means for enabling the connection between the latch structure 10 and the latch structure 11, designated by the reference numeral 13.

The first stage of the counter, shown in FIG. 3, is further provided with an inverter 14 in output to the latch structure 10.

Conveniently, the means for enabling connection between the latch structures 11 and 10, designated by the reference numerals 12 and 13, are constituted by pass gates.

With reference now to FIG. 4, which illustrates a stage of the counter that follows the first stage, and in which the stage for loading the external address is not shown (even in this stage that follows the first one), clearly there is an external address 5, enable means 6, storage means 3 and switching means 7 which are suitable to enable the passage of the address from the storage means 3 to the bit counter 2.

Figure 5:
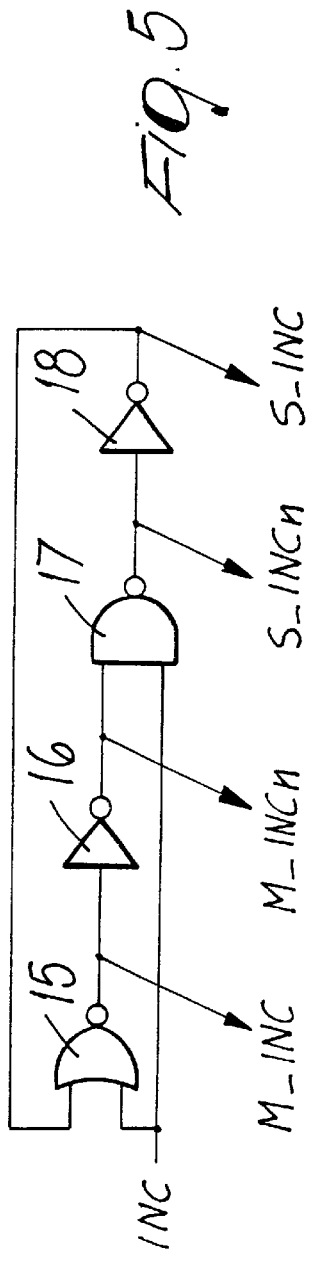
FIG. 5 is a circuit diagram of a source of signals for driving the counter stage according to the invention.

The enable means 12 and 13 are respectively driven by signals S-INC, S-INCn and M-INC, M-INCn, which are generated by a logic network which is shown in FIG. 5 and is constituted by a NOR gate 15, which receives in input the increment signal INC at one of its inputs, said signal being generated outside the counter stage. A cascade inverter 16 is cascade-connected to the NOR gate 15 and a NAND gate 17 is arranged therein; one input of said NAND gate is constituted by the output of the inverter 16 and the other input of said gate is provided by the signal INC. In output to the NAND gate 17 there is a second inverter 18, whose output is the signal S-INC, which is fedback to the NOR gate 15 in order to constitute a second input thereof together with the signal INC.

The signal M-INC is provided by the output of the NOR gate 15, the signal M-INCn is provided by the output of the inverter 16, and the signal S-INCn is provided by the output of the NAND gate 17.

The control signals produced by the network are in pairs and do not overlap, accordingly ensuring the absence of "chasing" effects in the various stages (i.e., "runaway" effects).

Going back to FIG. 4, the difference between the inverter stage of FIG. 4 and the inverter stage shown in FIG. 3 is the fact that each counter stage after the first one (such as the one shown in FIG. 4) is provided with a connection between the latch structure 10 and the latch structure 11 which can be provided according to two different paths, one being different from the other due to an inversion produced by the inverter 14.

In practice, each counter stage after the first one has a first path between the master structure 10, constituted by means for enabling the connection between the master structure 10 and the slave structure 11 which are enabled by the presence or absence of the input carry CARRY-IN and are designated by the reference numeral 20. Said connection enabling means are conveniently constituted by a pass gate. Likewise, the second path for connection between the master structure 10 and the slave structure 11, i.e., the path from the output of the inverter 14 to the slave structure 11, is controlled by second connection enabling means 21 which are also conveniently constituted by a pass gate.

The input carry signal CARRY-IN is fed to the N-channel transistor of the connection enabling means 20, whereas the signal CARRY-INN (i.e., the inverted equivalent of the preceding signal) is fed to the P-channel transistors of the first connection enabling means 20 and to the N-channel transistors of the second connection enabling means 21. The inverted input carry signal (CARRY-INN) is furthermore fed to carry generating means which are conveniently constituted by a pass gate 22 and by a P-channel transistor 23, whose gate terminal receives in input the carry signal CARRY-IN. The inverted input carry signal (CARRY-INN) is instead sent to the P-channel transistor of the pass gate 22, whose N-channel transistor is connected to the gate terminal of the P-channel transistor 23. In the P-channel transistor 23, the drain terminal which is connected to means for buffering the output carry (CARRY-OUT), designated by the reference numeral 24, which emit in output the output carry. The inverted output carry CARRY-OUTN is instead emitted by the pass gate 22.

As shown in FIGS. 3 and 4, the latch structure 11 provides in output the address Add-s, i.e., its content, which must be copied into the master latch 10 after enabling is granted by the means for enabling connection between the latch structure 11 and the latch structure 10, which are designated by the reference numeral 12.

With reference to the above figures, the operation of the bit counter stage according to the present invention is as follows.

In the presence of an address latch enable signal ALE-ext which is presented externally with respect to the counter stage, a signal ALE-fast is generated, likewise externally with respect to the stage, and allows to enable the tristate structure 6 and therefore to make the address ADD-I pass into the storage means 3, where it is stored temporarily.

Then, following the generation of the ALE pulse (which occurs only in case of an authentic request for update from outside), which differs from the address ALE-fast because it is delayed by said address, the switching means 7 are enabled and the address ADD-I previously stored in the storage means 3 is made to pass from said means 3 to the counter 2, indeed passing through the switching means 7 which are enabled by the signal ALE. This situation is shown in detail in the timing chart of FIG. 6.

Figure 6:
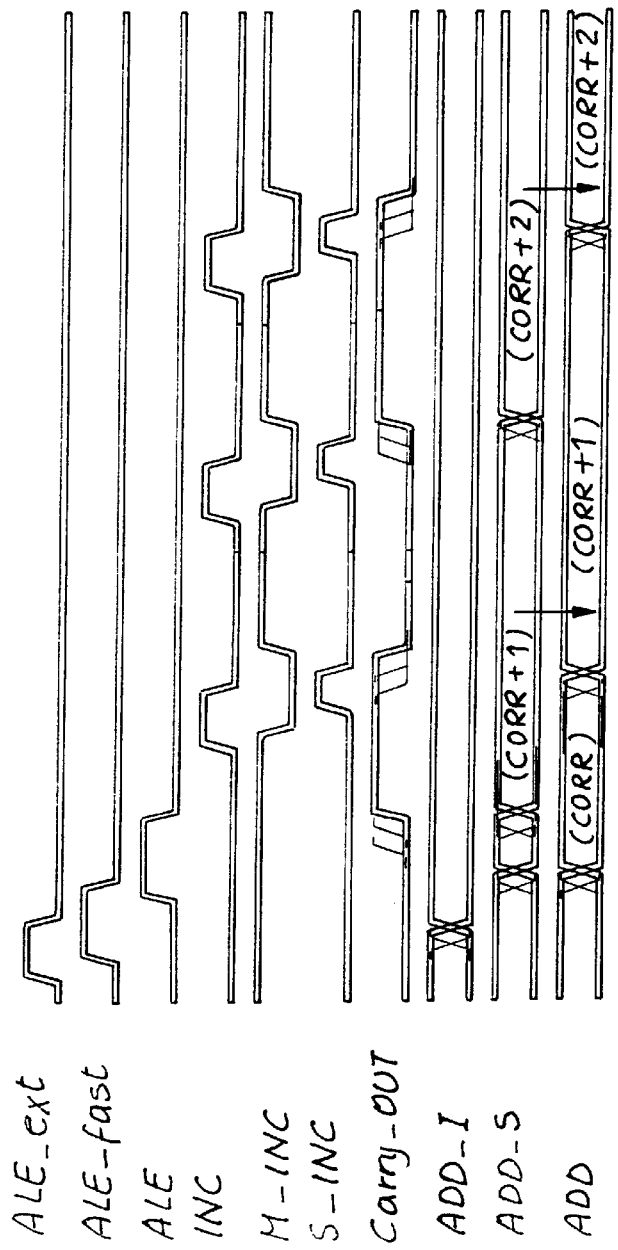
FIG. 6 plots the timings of the signals of the counter stage according to the present invention.

With reference now to the diagram of FIG. 3, which illustrates the first stage of a bit counter, it can be seen that once the address ADD-I has passed into the counter 2, it is in actual fact fed into the master storage means 10, which are always connected to the slave storage means 11, by virtue of the means 13. In this manner, the first stage has a particular configuration, since it has no input carry signal CARRY-IN (and its inverted signal). Then, following the generation of an increment signal INC, which is generated outside the counter stage and is the subject of a patent application in the name of this same Applicant, the means 13 are disabled, setting the signal M-INC low, as shown in FIG. 6, while the signal S-INC is set high, so as to enable the means 12 and therefore allow the connection between the slave storage means 11 and the master storage means 10.

In this manner, the address ADD-I stored in the master storage means 10 no longer passes through the connection enabling means 13 in order to reach the slave storage means 11. In practice, the connection between the master storage means 10 and the slave storage means 11 occurs in a mutually exclusive manner by way of the connection enabling means 13 and 12. Therefore, when the connection enabling means 13 are deactivated, i.e., when the path between the master storage means 10 and the slave storage means 11 is interrupted, the path between said slave storage means 11 and the master storage means 10, across the connection enabling means 12, is active, allowing to copy from the slave storage means 11 the content that is present therein into the master storage means 10.

In this manner dangerous "runaway" effects of the counter stage are avoided, since otherwise one would have a continuous updating of the address if the paths between the master storage means 10 and the slave storage means 11 were even briefly simultaneously active.

The counter stage shown in FIG. 3 (first stage) emits in output both the address ADD and an output carry CARRY-OUT, which constitutes the input carry signal CARRY-IN for a second counter stage which can be as shown in FIG. 4. All the subsequent counter stages are similar to the one shown in FIG. 4.

With reference therefore to the chart of FIG. 6, it can be seen that the address ADD-I is the current address, whereas the address ADD (output address) is equal to the current address CORR until an increment signal INC occurs and therefore the current address, incremented by means of the carry execution means and stored in the slave storage means 11, is finally written to the master storage means 10, when the signal S-INC becomes high.

Therefore the output address ADD is updated to the address CORR+1 only if the signal S-INC simultaneously becomes high.

The updating of the address from CORR to CORR+1 is instead performed preemptively and is stored in the slave storage means 11 but is not presented to the master storage means 10 until the signal S-INC occurs.

The address that is present in the master storage means 10 therefore has two path options for reaching the slave storage means 11, depending on whether the input carry signal CARRY-IN is present or not. If the input carry signal CARRY-IN is high, then the connecting path through the pass gate 20 is enabled and therefore the contents of the master storage means 10 pass without inversion into the slave storage means 11 and the output carry is calculated by the transistor 23 by means of the pass gate 22.

Otherwise, the connecting path that occurs after the inverter 14, through the pass gate 21, is enabled and therefore the contents of the master storage means 10 undergo inversion through the inverter 14 and then pass through the pass gate 13 and reach the slave storage means 11.

The carry execution means actually provide a multiplication for the input carry CARRY-IN and the data item (address) contained in the master storage means 10 and copy said product to the slave storage means 11; both the data item (address) and the input carry signal CARRY-IN contribute to the calculation of the output carry CARRY-OUT, which is then sent to a subsequent bit counter stage, similar to the stage being considered, in order to constitute its input carry signal CARRY-IN.

In practice, it has been observed that the external address ADD-IN is fed into the counter exclusively due to the presence of an assured address latch signal ALE; this therefore allows to contain the consumption of the counter stage with respect to conventional solutions in which the counter stage performs the calculation anyway, without realizing whether the address presented externally thereto really is an address that must be updated or is an address which generates a false loading.

Therefore, each counter stage is isolated from the outside world by means of the tristate structure 6 and then by means of the switching means 7, which are driven by an authentic address latch signal ALE.

Moreover, the updating of each counter stage is performed at a different time with respect to the copying of the updated address in the master storage means.

Moreover, the time dedicated to the calculation of the carry is much longer than the time dedicated to the writing of said carry, and this allows to increase the operating frequency of the counter.

During counting, stimuli that are external to the counter are disabled and protection is provided with respect to external loadings, allowing to recognize noise-related or non-authentic signals, thus allowing overwritings of the counter stage only if this is intended.

Figure 7B:
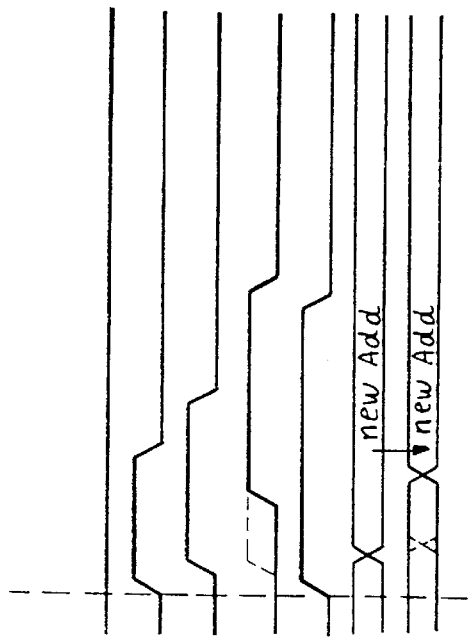
FIGS. 7a–7c plot the timing of the signals of the counter stage according to the present invention in three different operating modes.
Figure 7A:
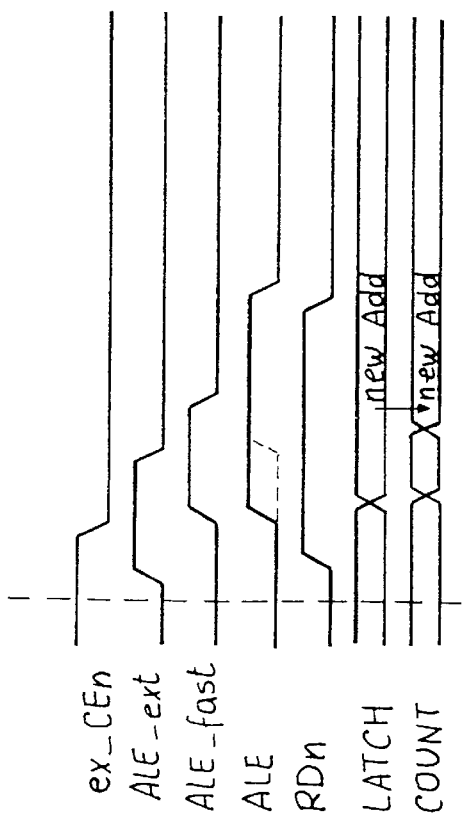
Figure 7C:
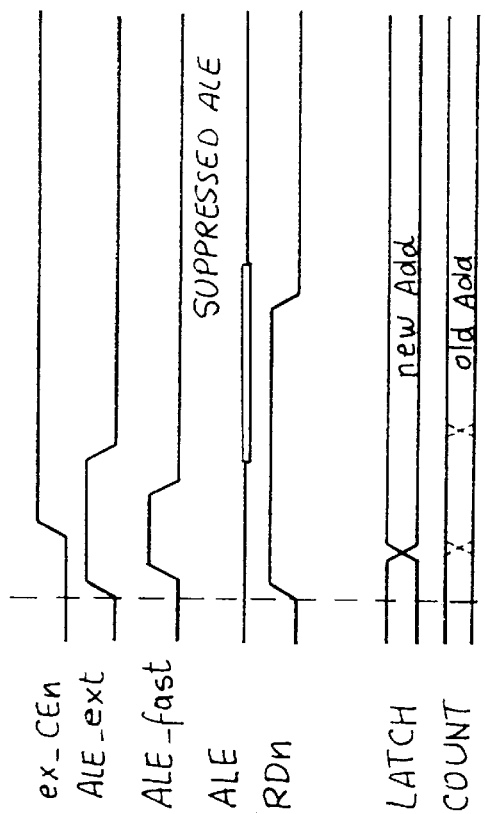

The charts of FIGS. 7a–7c plot different situations in which FIG. 7a shows the transition from a standby state to an active mode in which the signal ALE is generated with a delay with respect to the signal ALE-ext, and following an inverted read signal RDen the counter (designated in this case by a signal COUNT) updates its own address.

The counter stage thus conceived is susceptible of numerous modifications and variations, all of which are within the scope of the inventive concept; all the details may furthermore be replaced with other technically equivalent elements.

What is claimed is:

1. A bit counter stage, particularly for memory addresses, comprising:

master storage means;

slave storage means which are connected to said master storage means;

means for enabling transit of an external address in said master storage means;

means for enabling a first connection between said slave storage means and said master storage means;

means for enabling a second connection between said master storage means and said slave storage means, the second connection connecting said slave storage means to said master storage means independently of said first connection connecting said slave storage means to said master storage means;

means for calculating a product of said external address and of an input carry signal which arrives from a preceding counter stage; and means for calculating an output carry signal on the basis of said external address and of said input carry signal.

2. The bit counter stage according to claim 1, wherein said master storage means and said slave storage means each comprise a latch.

3. The bit counter stage according to claim 1, wherein said means for enabling the first connection between said slave storage means and said master storage means comprise a pass gate which is driven by a slave storage means increment signal.

4. The bit counter stage according to claim 1, wherein said means for enabling the second connection between said master storage means and said slave storage means comprise a pass gate which is driven by a master storage means increment signal.

5. The bit counter stage according to claim 1, wherein said means for calculating the product of said external address and of said input carry signal comprise a first circuit path and a second circuit path, each circuit path being enabled by a respective pass gate which is driven by said input carry signal and by the inverted equivalent thereof, inverter means being connected in output to said master storage means, said first circuit path beginning upstream of said inverter means and said second circuit path beginning downstream of said inverter means.

6. The bit counter stage according to claim 5, wherein said first circuit path comprises a pass gate which is driven by said external address and by said input carry signal and the inverted equivalent thereof.

7. The bit counter stage according to claim 5, wherein said second circuit path comprises a pass gate which is driven by said inverted external address and by said input carry signal and by the inverted equivalent thereof.

8. The bit counter stage according to claim 5, wherein said first and second circuit paths are mutually exclusive and are connected to said means for enabling the first connection between said master storage means and said slave storage means by means of an inverter.

9. The bit counter stage according to claim 1, wherein said means for calculating the output carry signal comprise a pass gate which is driven by said input carry signal and by the inverted equivalent thereof, and by a P-channel transistor, said pass gate being connected to the gate terminal of said P-channel transistor.

10. The bit counter stage according to claim 9, wherein in said P-channel transistor the drain terminal is connected to an inverter whose output comprises said output carry signal.

11. The bit counter stage according to claim 1, further comprising means for temporary storage of said external address, and means for selectively connecting said means for the temporary storage of said external address and said master storage means.

12. The bit counter stage according to claim 11, wherein said means for temporary storage is enabled prior to said master storage means being enabled.

13. A counting method for a bit counter stage, particularly for addresses of a memory, comprising the steps of:

receiving an external address;

following a fast address latch enable signal, storing said external address in storage means and keeping said external address stored;

in the presence of an address latch enable signal which is delayed with respect to said fast address latch enable signal, storing said external address in master storage means;

following an increment signal and an input carry signal arriving from a preceding counter stage, calculating a new address which is incremented with respect to said external address and storing said new address in slave storage means which are connected to said master storage means;

calculating, on the basis of said external address and of said input carry signal, an output carry signal, said output carry signal being an input signal for a subsequent counter stage; and following a signal for enabling a connection between said slave storage means and said master storage means, copying the content of said slave storage means into said master storage means.

14. The method according to claim 13, wherein said new address differs from said external address if said input carry signal is high.

15. The method according to claim 14, wherein if said input carry signal is high, said step for calculating the output carry signal calculates said output carry signal as said external address.

16. The method according to claim 13, wherein said step of calculating said new address occurs before the step of copying said new address into said master storage means, the time delay between said two steps being dictated by said signal for enabling the connection between said slave storage means and said master storage means.

17. The method according to claim 14, wherein if said input carry signal is high, said external address stored in said master storage means is used to generate said new address; if said input carry signal is low, said external address stored in said master storage means is used in inverted form to generate said new address, which is equal to said external address and is subsequently stored in said slave storage means to be subsequently copied into said master storage means.

18. A bit counter stage, particularly for memory addresses, comprising:

master storage means;

slave storage means which are connected to said master storage means;

means for enabling transit of an external address in said master storage means;

means for enabling a first connection between said slave storage means and said master storage means;

means for enabling a second connection between said master storage means and said slave storage means;

means for calculating a product of said external address and of an input carry signal which arrives from a preceding counter stage; and means for calculating an output carry signal on the basis of said external address and of said input carry signal;

wherein said means for calculating the product of said external address and of said input carry signal comprise a first circuit path and a second circuit path, each path being enabled by a respective pass gate which is driven by said input carry signal and by an inverted equivalent thereof, inverter means being connected in output to said master storage means, said first circuit path beginning upstream of said inverter means and said second circuit path beginning downstream of said inverter means.

19. The bit counter stage according to claim 18, wherein said master storage means and said slave storage means each comprises a latch.

20. The bit counter stage according to claim 18, wherein:

said means for enabling the second connection between said slave storage means and said master storage means comprise a pass gate which is driven by a slave storage means increment signal.

21. The bit counter stage according to claim 18, wherein:

said means for enabling the first connection between said master storage means and said slave storage means comprise a pass gate which is driven by a master storage means increment signal.

22. A bit counter stage, particularly for memory addresses, comprising:

master storage means;

slave storage means which are connected to said master storage means;

means for enabling transit of an external address in said master storage means;

means for enabling a first connection between said slave storage means and said master storage means;

means for enabling a second connection between said master storage means and said slave storage means;

means for calculating the product of said external address and of an input carry signal which arrives from a preceding counter stage; and means for calculating an output carry signal on the basis of said external address and of said input carry signal;

wherein said means for calculating the output carry signal comprise a pass gate which is driven by said input carry signal and by an inverted equivalent thereof, and by a field effect transistor, said pass gate being connected to the gate terminal of said field effect transistor.

23. The bit counter stage according to claim 22, wherein said master storage means and said slave storage means each comprises a latch.

24. The bit counter stage according to claim 22, wherein:

said means for enabling the second connection between said slave storage means and said master storage means comprise a pass gate which is driven by a slave storage means increment signal.

25. The bit counter stage according to claim 22, wherein:

said means for enabling the first connection between said master storage means and said slave storage means comprise a pass gate which is driven by a master storage means increment signal.

26. A bit counter stage, particularly for memory addresses, comprising:

master storage means;

slave storage means which are connected to said master storage means;

means for enabling transit of an external address in said master storage means;

means for enabling a first connection between said slave storage means and said master storage means;

means for enabling a second connection between said master storage means and said slave storage means;

means for calculating the product of said external address and of an input carry signal which arrives from a preceding counter stage;

means for calculating an output carry signal on the basis of said external address and of said input carry signal;

means for temporary storage of said external address; and means for selectively connecting said means for temporary storage and said master storage means.

27. The bit counter stage according to claim 26, wherein said master storage means and said slave storage means each comprises a latch.

28. The bit counter stage according to claim 26, wherein:

said means for enabling the first connection between said slave storage means and said master storage means comprise a pass gate which is driven by a slave storage means increment signal.

29. The bit counter stage according to claim 26, wherein:

said means for enabling the second connection between said master storage means and said slave storage means comprise a pass gate which is driven by a master storage means increment signal.

30. A bit counter stage of a counter, comprising:

a master storage element;

a slave element;

circuitry for storing an externally generated data bit value in the master storage element;

a first circuit path selectively coupling the master storage element and the slave storage element;

a second circuit path selectively coupling the master storage element and the slave storage element, the second circuit path coupling the master and slave storage elements independently of the first circuit path coupling the master and slave storage elements;

circuitry for generating a data output signal based upon the state of the master storage element; and circuitry for generating a carry output signal based upon the state of the master storage element.

31. The bit counter stage of claim 30, wherein:

the master and slave storage elements each comprises a latch.

32. The bit counter stage of claim 30, wherein:

the first circuit path comprises a normally open transmission pass gate.

33. The bit counter stage of claim 32, wherein:

the second circuit path includes a normally closed transmission pass gate.

34. The bit counter stage of claim 33, wherein the normally closed transmission pass gate is configured in an open state for a time period during which the normally open transmission pass gate is configured in a closed state.

35. The bit counter stage of claim 30, wherein the second circuit path comprises:

a first transmission gate coupled in series between the slave storage element and the master storage element and enabled upon an assertion of a carry input signal; and a second transmission gate, coupled in series between the slave storage element and the master storage element and enabled upon a de-assertion of the carry input signal.

36. The bit counter stage of claim 35, wherein the second circuit path further comprises:

a normally open transmission pass gate coupled in series with the first transmission gate and with the second transmission gate.

37. The bit counter stage of claim 36, wherein the normally open transmission gate is configured in an open state in response to an assertion of an external increment signal.

38. The bit counter stage of claim 35, wherein:

the first transmission gate provides to the slave storage element a logical true version of the data value stored in the master storage element; and the second transmission gate provides to the slave storage element a logical complement version of the data value stored in the master storage element.

39. The bit counter stage of claim 30, wherein the circuitry for generating the carry output signal comprises:

a first transmission gate coupled between the master storage element and the carry output signal and configured in the closed position upon the assertion of a carry input signal.

40. The bit counter stage of claim 39, wherein the circuitry for generating the carry output signal further comprises:

a transistor coupled between a high reference voltage source and the carry output signal and having a control terminal coupled to the carry input signal.

41. The bit counter stage of claim 30, wherein:

the first circuit path is a non-inverting logic circuit path when enabled; and the second circuit path is an inverting logic circuit path when enabled.

42. The bit counter stage of claim 30, wherein the circuitry for generating a data output signal comprises a logic inverter coupled to the master storage element.

43. A method of operating a bit counter stage having a master storage element and a slave storage element, comprising:

maintaining a data value in the master storage element during a first time period;

updating, during at least a portion of the first time period, the slave storage element with a data value based upon the data value maintained in the master storage element and upon a carry input signal;

following the first time period, updating the master storage element with the data value stored in the slave storage element during a second time period; and following the second time period, generating a data output signal based upon the value stored in the master storage element during the second time period, the data output signal corresponding to an incremented representation of the data value maintained in the master storage element during the first time period.

44. The method of claim 43, further comprising:

prior to the first time period, storing an external data value into the master storage element.

45. The method of claim 43, further comprising:

during the first time period, generating a carry output signal based upon data value maintained in the master storage element during the first time period and upon the carry input signal.

46. The method of claim 43, further comprising:

following the second time period, generating a carry output signal based upon the data value stored in the master storage element during the second time period.

\* \* \* \* \*